United States Patent
Madathil et al.

(10) Patent No.: US 7,049,741 B2
(45) Date of Patent: *May 23, 2006

(54) ORGANIC LIGHT EMITTING DIODE WITH IMPROVED LIGHT EMISSION THROUGH SUBSTRATE

(75) Inventors: Joseph K. Madathil, Rochester, NY (US); Pranab K. Raychaudhuri, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 178 days.

This patent is subject to a terminal disclaimer.

(21) Appl. No.: 10/765,375

(22) Filed: Jan. 27, 2004

(65) Prior Publication Data

US 2005/0162074 A1   Jul. 28, 2005

(51) Int. Cl.
  H01J 1/62       (2006.01)
  H01J 63/04      (2006.01)
(52) U.S. Cl. ............ 313/504; 313/498; 313/506
(58) Field of Classification Search ......... 313/498, 313/503, 504, 506, 512
  See application file for complete search history.

(56) References Cited

U.S. PATENT DOCUMENTS

| 4,769,292 | A | 9/1988 | Tang et al. | 428/690 |
|---|---|---|---|---|
| 4,885,211 | A | 12/1989 | Tang et al. | 428/457 |
| 2004/0140758 | A1* | 7/2004 | Raychaudhuri et al. | 313/504 |
| 2005/0162075 | A1* | 7/2005 | Madathil et al. | 313/504 |

OTHER PUBLICATIONS

Tokito et al, Metal oxides as a hole-injecting layer for an organic electroluminescent device, J. Phys. D:Appl. Phys 29 (1996) 2750-2753.

Raychaudhuri et al, Performance Enhancement of Top- and Bottom-Emitting Organic Light-Emitting Devices Using Microcavity Structures, IDRC 03, pp. 10-13.

Lu et al, High-efficiency top-emitting organic light-emitting devices, Applied Physics Letters, Nov. 2002, pp. 3921-3923.

(Continued)

Primary Examiner—Joseph Williams
Assistant Examiner—Kevin Quarterman
(74) Attorney, Agent, or Firm—Raymond L. Owens (57) ABSTRACT

Bottom-emitting organic light-emitting diode device includes a semitransparent, reflective and conductive anode including a metal or metal alloy or both formed over a transparent substrate, a plurality of hole-injecting layers including a bilayer structure having a layer including an oxide and a layer including a fluorinated carbon disposed over the semitransparent, reflective and conductive anode, a plurality of organic layers formed over the plurality of hole-injecting layers and including an emissive layer having an electroluminescent material, and a reflective, opaque and conductive cathode of a metal or metal alloy or both provided over the plurality of organic layers, and the plurality of the hole-injecting layers being configured to reduce the drive voltage, and the transparency of the anode, the reflectivity of the cathode, and the thickness of the organic layers between the electrodes being selected to change the internal reflection of light.

22 Claims, 3 Drawing Sheets

OTHER PUBLICATIONS

Raychaudhuri et al, Fabrication of Lithium-Based Alloy Cathodes for Organic Light-Emitting Diodes by D C Magnetron Sputtering, SID 01 Digest, pp. 526-529.

Raychaudhuri et al, Fabrication of Sputtered Cathode for Organic Light-Emitting Diodes (OLED) Using Transparent Buffer, Proceedings of the 7th Asian Symposium on Information Display (ASID 2002), pp. 55-58.

Van Slyke et al, Organic electroluminescent devices with improved stability, Appl. Phys. Lett. 69 (15) Oct. 7, 1996, pp. 2160-2162.

* cited by examiner

ORGANIC LIGHT EMITTING DIODE WITH IMPROVED LIGHT EMISSION THROUGH SUBSTRATE

CROSS REFERENCE TO RELATED APPLICATIONS

Reference is made to commonly assigned U.S. patent application Ser. No. 10/347,013 filed Jan. 17, 2003 by Pranab K. Raychaudhuri et al, entitled "Organic Light-Emitting Diode (OLED) Display With Improved Light Emission Using a Metallic Anode", commonly assigned U.S. patent application Ser. No. 10/346,424 filed Jan. 17, 2003 by Yuan-Sheng Tyan et al, entitled "Microcavity OLED Devices", and commonly-assigned U.S. patent application Ser. No. 10/765,607 filed concurrently herewith, by Joseph K. Madathil et al, entitled "Organic Light Emitting Diode With Improved Light Emission Through the Cathode", the disclosures of which are herein incorporated by reference.

FIELD OF THE INVENTION

The present invention relates to a bottom-emitting organic light emitting diode (OLED), which use a semitransparent metallic anode.

BACKGROUND OF THE INVENTION

Organic electroluminescent (OEL) device, alternately known as organic light emitting diode (OLED), is useful in flat-panel display applications. This light-emissive device is attractive because it can be designed to produce red, green, and blue colors with high luminance efficiency; it is operable with a low driving voltage of the order of a few volts and clearly viewable from oblique angles. These unique attributes are derived from a basic OLED structure comprising of a multilayer stack of thin films of small-molecule organic materials sandwiched between an anode and a cathode. Tang et al in commonly-assigned U.S. Pat. Nos. 4,769,292 and 4,885,211 have disclosed such a structure. The common electroluminescent (EL) medium includes a bilayer structure of a hole-transport layer (HTL) and an electron-transport layer (ETL), typically of the order of a few tens of nanometer (nm) in thickness thick for each layer. When an electrical potential difference is applied at the electrodes, the injected carriers-hole at the anode and electron at the cathode-migrate towards each other through the EL medium and a fraction of them recombine to emit light. The intensity of electroluminescence is dependent on the EL medium, drive voltage, and charge injecting nature of the electrodes. The light viewable outside of the device is further dependent on the design of the organic stack and optical properties of the substrate, anode and the cathode. Conventional OLEDs are bottom emitting (BE), meaning that the display is viewed through the substrate that supports the OLED structure. The devices normally employ glass substrates having a layer of highly transparent indium-tin-oxide (ITO) layer that also serves as the anode. The cathode is typically a reflective thin film of MgAg although lithium-containing alloys are also known to provide efficient electron injection. The light generated within the device is emitted in all directions. About 80% of generated light is not available for viewing due to losses in wave-guiding modes in glass, ITO and organic layers. The light emitted toward the anode at less than the critical angle passes through the anode and the substrate to the viewer, and the light emitted in the opposite direction is reflected at the cathode and passes through the substrate, enhancing the viewing intensity. A high-transparency substrate and anode and a high-reflectivity cathode are thus preferred.

The OLED display is typically coupled with active matrix (AM) circuitry in order to produce high performance displays. For the AM bottom emitting display, the circuitry (bus metals, thin film transistors (TFTs), and capacitors) is competing with pixel-emitting areas for space in the substrate. For the displays employing complex circuitry in the backplane the open area through which the light emerges is reduced. The ratio of the open area to that of the entire device area is called the aperture ratio. Due to reduction of the aperture ratio the display will run dim. To compensate for the reduced average brightness level, the drive current is increased subjecting the display to increased risk of operational degradation. It follows that in the display design higher than normal efficiency is needed to counteract the effect of reduced aperture ratio. These devices have the prospect of running at low drive current while maintaining readability and thus extending the operational life. Moreover these displays are drivable at low voltage and with reduced power consumption.

Realizing ultra high-efficiency by reclaiming light lost to wave-guiding modes can be very difficult. To recover even a fraction of light the device architecture can be very complex. An approach to enhance the efficiency without introducing complexity is to implement the microcavity design of the device structure as has been described. By employing a microcavity structure including highly reflective electrodes one can significantly increase the emission through the bottom or top surface depending on the transparency of the electrodes. In the bottom emitting structure a reflective, semitransparent and conducting anode and a reflective, opaque and conductive cathode are employed.

In the microcavity device the light emitted out of the cavity depends on the cavity design. The resonance wavelength of a microcavity is given by $$2\Sigma(n_i d_i)/\lambda - (\Phi_1 + \Phi_2)/360° = m,$$

where m=0, 1, 2, . . . , $\lambda$ is the peak wavelength of the light emerging out of the cavity consisting of layers having the thickness $d_i$ and refractive index $n_i$, and $\Phi_1$ and $\Phi_2$ are the phase shifts of light in degrees upon reflection from the two reflecting electrodes. The quantity $n_i d_i$ is conventionally called the "optical path length" in the material, so $\Sigma (n_i d_i)$ is the total optical path length in the microcavity. For a fixed optical path length of the microcavity, the strength of this emission (and to a much lesser degree its wavelength) is also influenced by the location of the emission zone within the cavity. If a reasonable distance between the cathode and HTL/ETL interface is selected, we can then vary the HTL thickness in order to vary the optical path length of the microcavity. The maximum luminance occurs for an HTL thickness such that the resonance wavelength of the microcavity is well-aligned with the peak in the innate emission spectrum of the particular dopant-host material. The first maximum occurs at the HTL thickness corresponding to m=0, and subsequent maxima occur at the HTL thickness corresponding to m=1, 2 and so on.

Figure 1:
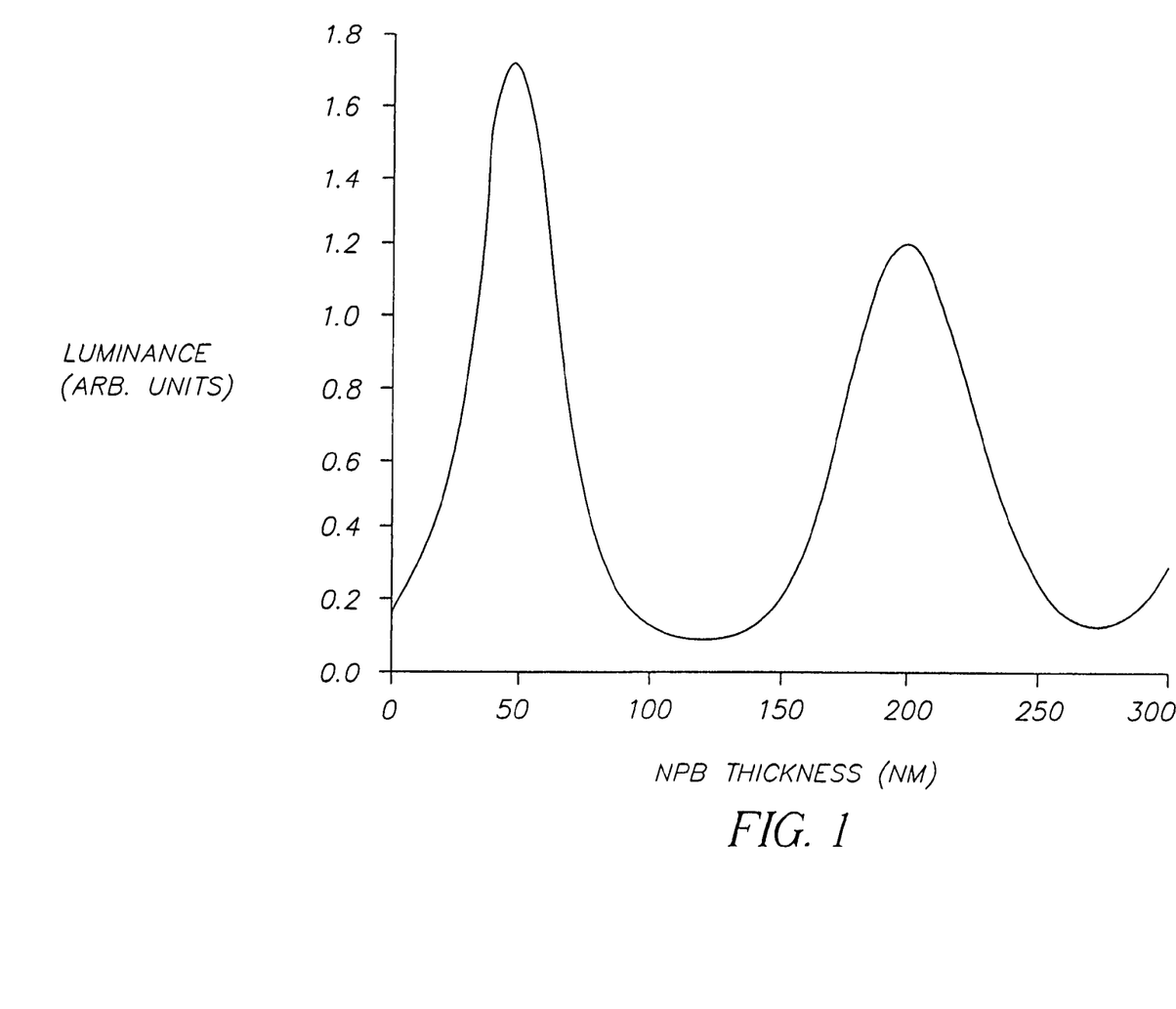
FIG. 1 shows the on-axis luminance determined by optical modeling of a bottom-emitting OLED as a function of the NPB HTL thickness in the following diode structure: Glass/20 nm Ag/variable NPB/60 nm Alq/200 nm MgAg.

FIG. 1 is a plot of luminance of a bottom-emitting microcavity structure as a function of NPB HTL thickness up to the thickness corresponding to m=1 as determined by optical modeling. The structure of the OLED is: Glass/20 nm Ag/variable NPB/60 nm Alq/200 nm MgAg and includes the reflective, semitransparent and conductive Ag anode deposited on the glass substrate. The MgAg top electrode (cathode) is the reflective, opaque and conductive. The Ag anode being thin and semitransparent allows significant emission through substrate.

FIG. 1 shows that for this structure the first maximum of the luminance occurs at about 50 nm and the second maximum occurs at about 200 nm of NPB thickness. It is obvious that such plots for the emission at other wavelengths will be similar to the FIG. 1 but the cavity length will be slightly different, and the maxima of resonance wavelengths will occur at slightly different NPB thicknesses. It has been found, however, that the OLED based on the above layer structure was inefficient. An interlayer between the Ag anode and the NPB HTL was found useful in lowering the operating voltage and improving the stability of the diode. The interlayer, comprising a fluorinated carbon or an oxide, is very thin (1 to 2 nm thick) and highly transparent. It thus does not significantly affect the optics of the OLED structure. The diode structure with about 50 nm NPB is most desirable for maximizing efficiency and minimizing the angular dependence of the color but the one with the thicker NPB layer is desirable from a manufacturing point of view. This is because the thin NPB can yield shorted OLEDs or OLEDs that can catastrophically fail in use. On the other hand, thick NPB HTL is likely to increase the drive voltage. It has been found, however, that the drive voltage of OLEDs having a $MoO_x$ HIL on an Ag anode and a thick NPB HTL is higher than can be accounted for solely by the increased NPB thickness.

SUMMARY OF THE INVENTION

It is therefore an object of the present invention to provide a bottom-emitting OLED device with reduced drive voltages.

It is another object of the present invention to provide a bottom-emitting OLED device with high operational stability.

It is another object of the present invention to provide a bottom-emitting OLED device with high efficiency.

These objects are achieved by a bottom-emitting OLED device, comprising:

a) a transparent substrate;

b) a reflective, semitransparent, and conductive anode layer including a metal or metal alloy or both formed over the substrate;

c) a plurality of hole-injecting layers disposed over the reflective, semitransparent and conductive anode layer, including a bilayer structure having a layer including an oxide and a layer including a fluorinated carbon;

d) a plurality of organic layers formed over the plurality of the hole-injecting layer and including an emissive layer having electroluminescent material;

e) a reflective, opaque and conductive cathode including a metal or metal alloy or both provided over the plurality of organic layers; and f) the plurality of the hole-injecting layers being configured to reduce the drive voltage, and the transparency of the anode and the reflectivity of the cathode, and the thickness of the organic layers between the electrodes being selected to change the internal reflection of light to thereby improve the emission through-substrate.

It has been discovered that, by using a bilayer configuration, for the hole-injection structure having an oxide layer and a fluorocarbon layer, the drive voltage is reduced, bottom-emission and operational stability are enhanced as well.

DETAILED DESCRIPTION OF THE INVENTION

Throughout the ensuing description acronyms are used to designate the names of the different organic layers and operating features of organic light-emitting diode devices. For reference they are listed in Table 1.

TABLE 1

| | |
|---|---|
| OLED | Organic light-emitting diode |
| OEL | Organic electroluminescent diode |
| ITO | Indium tin oxide |
| HIL | Hole-injection layer |
| CFx | Fluorinated carbon |
| MoOx | Molybdenum oxide |
| HTL | Hole-transport layer |
| EML | Emissive layer |
| ETL | Electron-transport layer |
| TEL | Transmission enhancement layer |
| NPB | 4,4'-Bis[N-(1-naphthyl)-N-phenylamino]biphenyl (NPB) |
| Alq | Tris(8-hydroxyquinoline) aluminum |
| MgAg | Mg(95 v %) Ag(5 v %) alloy |

Figure 2:
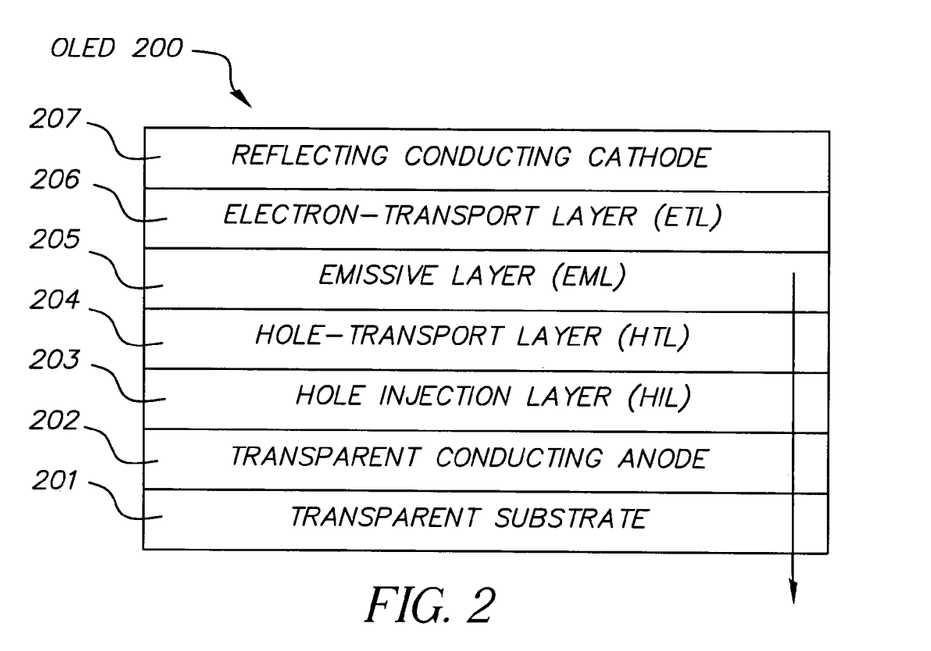
FIG. 2 shows schematically the layer structure of a conventional bottom-emitting OLED of prior art.

Turning now to FIG. 2, the OLED 200 is a prior art device including a transparent substrate 201, a low reflectivity and highly transparent and conductive anode 202, a hole-injection layer (HIL) 203, a hole-transport layer (HTL) 204, an emissive layer (EML) 205, an electron-transport layer (ETL) 206, and a reflecting, opaque and conductive cathode 207. In operation, the anode and the cathode are connected to a voltage source and electrical current is passed through the organic layers, resulting in light emission or electroluminescence from the emissive layer. The intensity of generated light is dependent on the magnitude of the electrical current passed through the OLED device, which in turn is dependent on the luminescent and electrical characteristics of the organic layers as well as the charge-injecting nature of the anode 202, hole-injection layer 203, and cathode 207. The emission viewable is further dependent on the optical characteristics of the substrate 201, anode 202, cathode 207 and the layer structure of the device.

Figure 3:
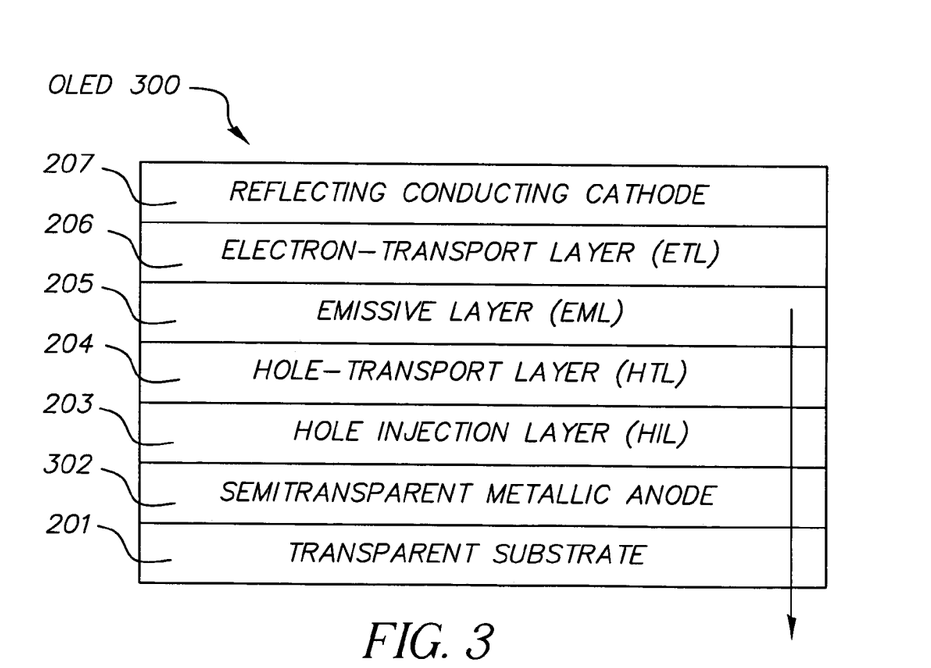
FIG. 3 shows schematically the layer structure of a bottom-emitting microcavity OLED of prior art.

FIG. 3 shows the device structure of a bottom-emitting microcavity OLED 300 of prior art. In this embodiment the layer 302 is the anode including a reflective, semitransparent and conductive metallic layer and is disposed between the substrate 201 and the hole-injecting layer 203, otherwise the OLED 300 is similar to prior art OLED 200. When energized the device emits light which, like the prior art OLED 200, is viewable through substrate. However, the optical properties of the anode and thickness of organic layers are to be optimized for efficiency maximization.

Figure 4:
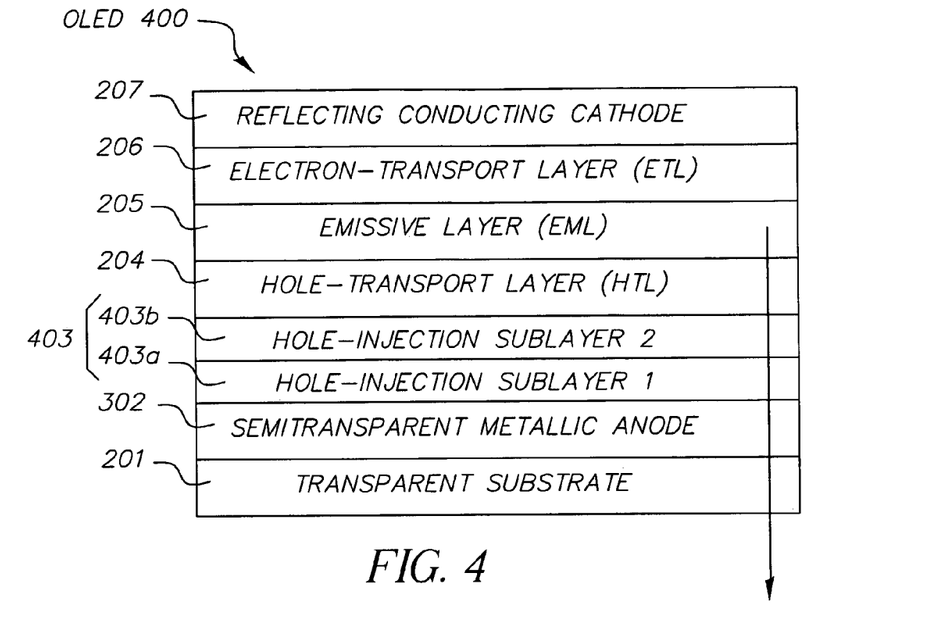
FIG. 4 shows schematically the layer structure of a bottom-emitting microcavity OLED of the present invention.

FIG. 4 shows the device structure of a bottom-emitting microcavity OLED 400 of the present invention. In this embodiment the anode 302 can be similar to the anode 302 of the OLED 300 (FIG. 3). In this configuration the layer 403 includes hole injecting sublayers, 403a and 403b, otherwise the structure is similar to the OLED 300 (FIG. 3). The bilayer hole injecting structure 403 is inserted between the anode 302 and hole transport layer 204, the layer 403a contacts anode 302 and hole injecting sublayer 403b, and the hole injecting sublayer 403b is disposed between the hole injecting sublayer 403a and hole transport layer 204 (FIG. 4). The 403a and 403b layers are termed here after as the sublayer 1 and sublayer 2, respectively.

Figure 5:
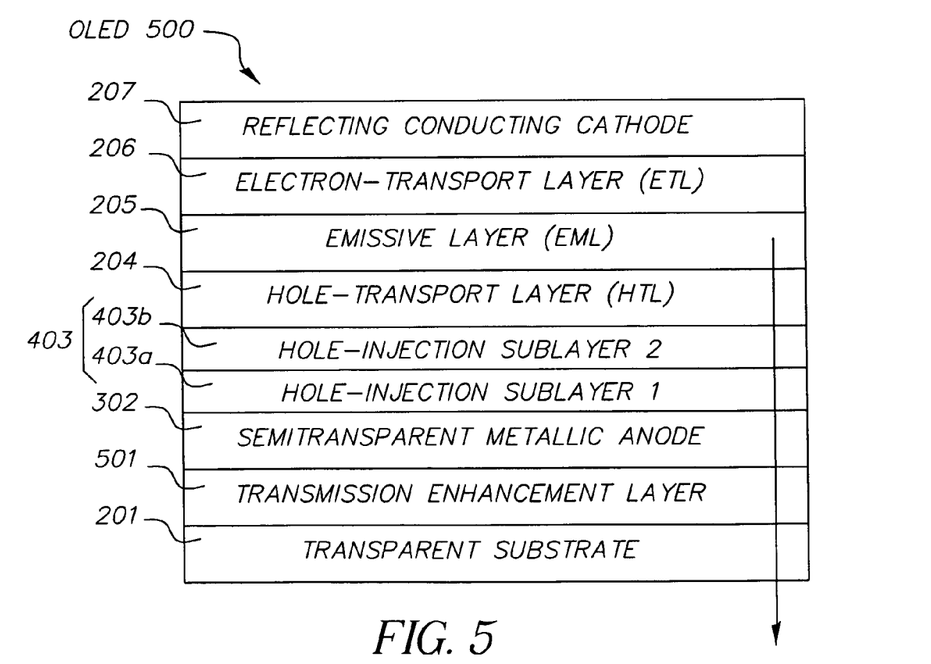
FIG. 5 shows schematically the layer structure of another embodiment of the bottom-emitting microcavity OLED of the present invention.

In another embodiment of the present invention OLED 500, presented in FIG. 5, a transmission enhancement layer 501 is placed between the transparent substrate 201 and the semitransparent metallic anode 302 to further enhance the emission through the substrate. The OLED 500 is otherwise similar to device OLED 400. However, the optical properties of the layer 501 are to be selected and the 500 OLED structure is to be optimized to achieve maximization of emission through the substrate 201.

Substrate 201 can include glass, ceramic, or plastics. For diodes emitting through substrate, the substrates should be as transparent as possible. Since the OLED device fabrication does not require high temperature process, any substrate that can withstand process temperatures of the order of 100° C. is useful, which includes most thermal plastics. The substrate can take the form of rigid plate, flexible sheet, or curved surfaces. Substrate 201 can include active-matrix substrates, which contain electronic addressing and switching elements. Active-matrix substrates can contain high temperature polysilicon thin-film-transistors, low temperature polysilicon thin-film-transistors or amorphous silicon thin film transistors. Those skilled in the art will appreciate that other circuit elements can be used to address and drive the OLED devices.

Anode 202 (FIG. 2) provides the function of injecting holes into the organic layer when a positive potential relative to the cathode 207 is applied to the OLED 200. It has been shown, for example, in commonly assigned U.S. Pat. No. 4,720,432, that indium tin oxide (ITO) acts as an efficient anode with good hole-injecting properties because it has a relatively high work function. Since the ITO film itself is conducting and highly transparent, commercially available ITO-coated glass provides an excellent low reflectivity support for the fabrication of OLED200 type diodes (FIG. 2). The OLEDs 300, 400 and 500 (FIG. 3, FIG. 4 and FIG. 5) use a reflective, semitransparent, and conductive anode layer 302 formed over the transparent substrate 201 (FIG. 3, FIG. 4 and FIG. 5). The anode can include reflective materials including metals and alloys having significant transmittance at the emission wavelength. Such metals include Ag, Al, Mg, Zn, Rh, Ru, Ir, Au, Cu, Pd, Ni, Cr, Pt, Co, Te, or Mo, or alloys or mixtures thereof. The thickness of the layer 302 is selected to be weakly absorbing. By weakly absorbing it is meant that the absorption of a film on glass is less than 30%. Depending on the metals the thickness of the layer should be greater than about 4 nm but less than about 50 nm. The layer 302 can be deposited by conventional deposition processes and can also be compatible with the manufacturing process for OLED. These layers can function as anodes with good hole-injecting properties with and without an overlying hole-injecting layers 203 (FIG. 3) or 403 (FIGS. 4 and 5. In general high workfunction materials are believed to inject holes to NPB HTL with reasonably high efficiency whereas the low workfunction materials are likely to be inefficient hole injectors. However it has been found that the anode layer 302 including low or and high workfunction materials can further benefit from an overlying hole injecting layer.

Hole-injection layer 203 provides the function of increasing the efficiency of the hole-injection from the anode 202 (FIG. 2) to the HTL 204. It has been shown, for example, in commonly assigned U.S. Pat. No. 4,885,211, that a porphorinic or phthalocyanine compound is useful as a hole injection layer 203 to the HTL 204 of the prior art OLED 200 device (FIG. 2), resulting in increased luminance efficiency and operational stability. Other preferred HIL materials include $CF_x$, which is a fluorinated polymer deposited by plasma-assisted vapor deposition, wherein x is less than or equal to 3 and greater than 0. The method of preparation and the characteristics of $CF_x$ have been disclosed in commonly assigned U.S. Pat. No. 6,208,077. Other materials can also be used as hole injectors. A layer of an oxide of Mo, V or Ru, each about 30 nm thick, on 120 nm thick ITO anode has been found useful as a hole injector to TPD, an HTL layer ("Metal oxides as a hole-injecting layer for an organic electroluminescent device", S. Tokito, K. Noda and Y. Taga, J. Phys. D; Appl. Phys. 29, 2750 (1996). The OLED having an Ag anode layer and not having an HIL layer was found to yield OLEDs with high drive voltages presumably due to poor hole injection arising from low workfunction of Ag. ("Performance Enhancement of Top- and Bottom-Emitting Organic Light-Emitting Devices Using Microcavity Structures", P. K. Raychaudhuri*, J. K. Madathil, Joel D. Shore and Steven A. Van Slyke, Proceedings of the 23rd International Display Research Conference, Phoenix, Ariz., Sep. 16 to 18, 2003 p 10). An ITO layer on a Ag reflector has been used to enhance hole injection from the anode that otherwise would not allow efficient hole injection to the HTL directly from the Ag (M.-H. Lu, M. S. Weaver, T. X. Zhou, M. Rothman, R. C. Kwong, M. Hack, and J. J. Brown, "High-efficiency top-emitting organic light-emitting devices", Appl. Phys. Lett. 81, 3921 (2002). An electrode structure comprising a conductive layer, a non-metal layer and a fluorocarbon layer and further comprising a buffer layer between the conductive layer and the non metal layer has been disclosed (WO 03/055275 A1). The oxide was based on a material selected from one of the groups: 3d transition metal group IIIA group, IVA group, rare metal group or a combination thereof. A hole injecting layer including CFx or an oxide was found to provide efficient hole injection from many metal anodes regardless of the work-function yielding OLEDs with high efficiency. ("Performance Enhancement of Top- and Bottom-Emitting Organic Light-Emitting Devices Using Microcavity Structures", P. K. Raychaudhuri*, J. K. Madathil, Joel D. Shore and Steven A. Van Slyke, Proceedings of the 23rd International Display Research Conference, Phoenix, Ariz., Sep. 16 to 18, 2003 p 10). The $CF_x$ layer was prepared by decomposition of $CHF_3$ gas in RF plasma. The oxide layer can be $MoO_x$ and may prepared by vacuum evaporation of $MoO_3$. The deposited film can be non-stoichiometric having the composition represented by $MoO_x$ (0<x<3). In accordance with the present invention, a HIL structure comprising a plurality of hole injecting sublayers disposed between the anode 302 and the HTL 204 was found to further enhance the hole injection from a metallic anode. A bilayer HIL structure 403 (FIGS. 4 and 5)—having the sublayer 403b of CFx on the sublayer 403a of $MoO_x$—was found particularly effective in lowering drive voltage for the OLEDs having a thick NPB HTL and in improving the operational stability of the OLEDs. In the OLED 400 and 500 (FIGS. 4, 5) the oxide layer 403a is in contact with the anode 302 and the fluorinated carbon layer 403b. The fluorinated carbon layer 403b is in contact with the oxide layer 403a and the HTL 204. Other oxide hole injectors for metallic anodes can include the oxides of Vanadium, ITO, IZO, $Pr_2O_3$, $TeO_2$, or $SiO_2$ or mixtures thereof.

Hole-transport layer 204 provides the function of transporting holes to the emissive layer (EML) 205. HTL materials include various classes of aromatic amines as disclosed in commonly assigned U.S. Pat. No. 4,720,432. A preferred class of HTL materials includes the tetraaryldiamines of formula (I).

(I)

wherein:
Ar, Ar1, Ar2 and Ar3 are independently selected from among phenyl, biphenyl and naphthyl moieties;
L is a divalent naphthylene moiety or dn;
d is a phenylene moiety;
n is an integer of from 1 to 4; and
at least one of Ar, Ar1, Ar2 and Ar3 is a naphthyl moiety.
Useful selected (fused aromatic ring containing) aromatic tertiary amines are the following:
4,4'-Bis[N-(1-naphthyl)-N-phenylamino]biphenyl (NPB)
4,4''-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthalene
2,6-Bis[di-(1-naphtyl)amino]naphthalene The thickness of the layer 204 is dependent on the OLED structure. For the OLEDs 300, 400 and 500 (FIGS. 3, 4 and 5) the emission is very sensitive to the layer thickness 204 as shown in FIG. 1. The modeling covering only a limited range of NPB thickness shown in FIG. 1 shows that for the OLED structures (FIGS. 3–5) the thickness of NPB layer should be about 50 or 200 nm for maximization of green emission. The appropriate thickness of NPB for emission of other colors is slightly different. The thickness of the hole-transport layer for full color top-emitting device should be is in the range of 20 nm to 80 nm or 180 nm to 230 nm.

Emissive layer 205 (FIGS. 2–5) provides the function of light emission produced as a result of recombination of holes and electrons in this layer. A preferred embodiment of the emissive layer includes a host material doped with one or more fluorescent dyes. Using this host-dopant composition, highly efficient OLED can be constructed. Simultaneously, the color of the EL diodes can be tuned by using fluorescent dyes of different emission wavelengths in a common host material. Tang et al. in commonly assigned U.S. Pat. No. 4,769,292 has described this dopant scheme in considerable detail for OLED diodes using Alq as the host material. As set forth in the Tang et al. commonly assigned U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; and alkyl substituted 9,10 dinaphthyl anthracene, as disclosed in Shi et al. commonly assigned U.S. Pat. No. 5,935,721.

Dopant materials include most fluorescent and phosphorescent dyes and pigments. Preferred dopant materials include coumarins such as coumarin 6, dicyanomethylenepyrans such as 4-dicyanomethylene-4H pyrans, as disclosed in Tang et al. commonly assigned U.S. Pat. No. 4,769,292 and in Chen et al. in commonly assigned U.S. Pat. No. 6,020,078. The thickness of the layer 205 is selected to allow charge recombination in this layer for maximization of intensity and purity of colors. The thickness is generally in the range of several tens of nanometers.

Electron-transport layer 206 (FIGS. 2–5) provides the function of delivering electrons injected from the cathode to emissive layer 205 (FIGS. 2–5). Useful materials include Alq, benzazoles, as disclosed in commonly assigned Shi et al. commonly assigned U.S. Pat. No. 5,645,948. The thickness of the layer 206 is dependent on the design of the OLED and is aimed at maximizing luminance and minimizing the drive voltage. In general the layer 206 can be in the range of about 10 to about 60 nm. The combined thickness of layer 205 and 206 is typically about 60 nm although it can be in the range of 40 to 100 nm. Since the selected thickness of the layer 204 can be in the range of 20 to 80 or 180 to 230 nm and the thickness of layer 403 is only few nanometers the combined thickesses of all layers between the anode and the cathode is either 60 to 180 nm or 220 to 330 nm.

Cathode 207 (FIGS. 2–5) is typically a reflective, opaque and conducting thin film, about 50 to 500 nm thick, and comprised of materials including alloys capable of efficiently injecting electrons into the ETL 206 (FIGS. 2–5). Metals and metal alloys with work-functions of <4.0 eV can be used as the as the cathode. Mg and Li alloyed with high reflectivity metals like Ag or Al is generally used because they have low work function and high reflectivity. Metallic alloys of alkali metals, alkali earth metals can be useful. Other low workfunction metals like Mg or its alloys can also be useful as cathode. The cathode layer is generally vapor deposited on ETL (FIGS. 2–5) although it is possible to use sputtering deposition (P. K. Raychaudhuri, C. W. Tang, J. K. Madathil, "Fabrication of Lithium-based alloy cathodes for organic light-emitting diodes by D C Magnetron sputtering", SID 2001 International Symposium (June 5–7, San Jose, Calif.) Digest, paper 31.4; Vol. 32, pp. 526–529, 2001, and (P. K. Raychaudhuri and J. K. Madathil, "Fabrication of Sputtered Cathodes for Organic Light-Emitting Diodes Using Transparent Buffer", Proceedings of the 7th Asian Symposium on Information Display (September 2–4, Singapore a) Digest, paper 50; Vol. 32, pp. 55–58, 2002).

The layer 501 (FIG. 5) is a transmission enhancement layer (TEL) inserted between the substrate 201 and the semitransparent anode 302 to further increase the emission through substrate. This layer is highly transmissive and can be of a single layered or a multilayered structure including conductive or nonconductive materials including but not limited to: ITO, indium zinc oxide (IZO), tin oxide (TO), antimony-doped tin oxide (ATO), fluorine-doped tin oxide (FTO), indium oxide (IO), zinc oxide (ZO), cadmium stannate (CTO), cadmium oxide, phosphorus-doped TO, and aluminum-doped ZO, MgO, $MoO_x$, $SiO_2Al_2O_3TiO_2$, $ZrO_2$, SiN, AlN, TiN, ZrN, SiC, or $Al_4C_3$, or mixtures thereof. Depending on the optical indices of the material the thickness of layer 501 can range from 20 nm to 150 nm.

Most OLEDs are sensitive to moisture or oxygen or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation.

OLEDs of this invention can employ various well-known optical effects in order to enhance their properties if desired. This includes optimizing layer thicknesses to yield maximum light transmission, replacing reflective electrodes with light-absorbing electrodes to enhance contrast, providing anti-glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

EXAMPLES

Prior art microcavity OLEDs and OLEDs of the present invention were fabricated on glass substrate coated with a semitransparent metallic layer deposited by sputtering in Ar containing atmosphere. These metallized glass substrates were then coated either with a $CF_x$ hole-injection layer or with a vapor deposited $MoO_x$ hole injection layer or with the said two hole-injecting layers in several combinations The $CF_x$ layer is thin and was deposited by decomposing $CHF_3$ gas in RF plasma. The substrates were then transferred to a vacuum coater operating at $\sim 1\times 10^{-6}$ Torr, where the organic stack including NPB HTL, and Alq EML/ETL were deposited in sequence. A thick cathode layer of LiF/Al or MgAg (5 v % Ag) was then deposited through a square mask, which defined an active area of 0.1 $cm^2$ for the OLED. Finally, the OLEDs were hermetically encapsulated in a glove box filled with dry nitrogen. When energized the emitted light emerged through the semitransparent metallic anode and the transparent substrate. The luminance of the diodes was determined using a Photo Research PR650 spectroradiometer as a function of drive current. The voltage and luminance given here are those obtained when a current corresponding to 20 $mA/cm^2$ was passed through the diodes and luminance being determined in the direction normal to the device surface. The operational stability of the OLEDs was tested at a constant current of 80 mA/cm2 as outlined by VanSlyke et. al ("Organic electroluminescent devices with improved stability" S. A. VanSlyke, C. H. Chen, and C. W. Tang, Appl. Phys. Lett. 69, 2160 (1996). The drive voltage was continuously adjusted to keep the operational current fixed. From these data were determined two parameters characteristic of operational degradation of the OLED. They were the half life- the time required for the luminance to drop to half of its initial value and the drive voltage increase rate (AVIR) averaged over the testing period.

Example 1

Ag layer, 20 nm thick, to function as a semitransparent anode was deposited by sputtering on several glass substrates. Over the Ag surface a $CF_x$ and a $MoO_x$ layer were deposited in several configurations followed by deposition of a 200 nm thick NPB HTL, a 60 nm thick Alq EML/ETL, and a reflective and opaque cathode layer. The hole injecting layer that contacts the Ag anode is termed as the sublayer 1 and that the hole injecting layer that is disposed on the sublayer 1 is termed as the sublayer 2. The cathode layer was comprised of a 100 nm thick Al layer vapor deposited on a 0.5 nm LiF layer. The hole-injection layer structure and performance of the diodes are shown in Table 2.

TABLE 2

| OLED ID | HIL sublayer 1 | HIL sublayer 2 | Drive voltage (V) | Efficiency (cd/A) |
|---|---|---|---|---|
| 1A | 1 nm $CF_x$ | 2 nm $MoO_x$ | 12.1 | 5.4 |
| 1B | 2 nm $MoO_x$ | | 11.2 | 5.5 |
| 1C | 2 nm $MoO_x$ | 1 nm $CF_x$ | 7.2 | 5.3 |

The OLED 1B having only the $MoO_x$ HIL exhibits significantly higher drive voltage than the OLED IC that has a $CF_x$ HIL in addition to the $MoO_x$ HIL. The OLED 1C having a bilayer hole-injection structure including the 1 nm $CF_x$ on the 2 nm thick $MoO_x$ has the lowest drive voltage among all the OLEDs of Table 2. The OLED 1A having a hole-injection bilayer structure comprising the same two HIL layers but in the reverse order as that of the OLED 1C, exhibits significantly higher drive voltage than the OLED 1C. The efficiency of all these OLEDs, however, is comparable. The drive voltage of the OLED1A and 1B are comparable, and are much higher than that of the OLED 1C. Thus, the hole injection from the bilayer structure $MoO_x/CF_x$ to the 200 nm NPB HTL is more efficient than the injection from the $MoO_x$ layer.

The operational degradation parameters of the these diodes are tabulated in Table 3

TABLE 3

| OLED ID | HIL sublayer 1 | HIL sublayer 2 | Half-life (hr) | AVIR (mV/hr) |
|---|---|---|---|---|
| 1A | 1 nm $CF_x$ | 2 nm $MoO_x$ | 58 | 24.8 |
| 1B | 2 nm $MoO_x$ | | 162 | 7.5 |
| 1C | 2 nm $MoO_x$ | 1 nm $CF_x$ | 275 | 2.1 |

The data presented in Table 3 for the OLED1A show that the $CF_x$ layer in contact with the Ag anode result in device with poor stability as evidenced by its short half-life (58 hours) and a large AVIR (24.8 mV/hr). On the other hand the $MoO_x$ in contact with the Ag anode yields greatly improved device with high stability and low AVIR (OLED 1B). Employing the bilayer HIL configuration—$MoO_x$ adjacent to Ag anode and CFx adjacent to HTL-, as in the OLED 1C, the stability is further improved. The stability of OLED 1C is about 5 times of that of the OLED 1A, which has the same two HILs but in the reverse order.

Example 2

Ag layer, 20 nm thick, to function as a semitransparent anode was deposited by sputtering on several glass substrates. Over the Ag surface a $CF_x$ and a $MoO_x$ layer were deposited in several configurations followed by deposition of a 200 nm thick NPB HTL, a 60 nm thick Alq EML/ETL, and a reflective and opaque cathode layer as in the case of Example 1. The reflective opaque cathode in this example is a 210 nm thick MgAg (5 v % Ag) alloy layer. The layer structure and performance of the OLEDs are shown in Table 4.

TABLE 4

| OLED ID | HIL sublayer 1 | HIL sublayer 2 | Drive voltage (V) | Efficiency (cd/A) |
|---|---|---|---|---|
| 2A | 1 nm $CF_x$ | | 7.4 | 3.9 |
| 2B | 2 nm $MoO_x$ | | 9.5 | 4.3 |
| 2C | 2 nm $MoO_x$ | 1 nm $CF_x$ | 7.5 | 4.0 |

The OLED 2B having only the $MoO_x$ HIL exhibits significantly higher drive voltage than the OLED 2C that has a $CF_x$ HIL in addition to the $MoO_x$ HIL. The OLED 2C having the bilayer hole-injection structure including the 1 nm $CF_x$ on the 2 nm $MoO_x$ has lower drive voltage than the OLED 2B. The OLED 2A, unlike the OLED 1A (Table 2), has only one HIL of CFx between the Ag anode and the NPB HTL and exhibits low voltage. The drive voltage of the OLED 2A and 2C are comparable. This suggests that the hole injection from the $CF_x$ layer to the 200 nm NPB HTL (OLED 2A) is efficient and is not influenced by the $MoO_x$ layer beneath the $CF_x$ layer (OLED 2C). The efficiency of all these OLEDs appears comparable.

The operational degradation parameters of the OLEDs are tabulated in Table 5.

TABLE 5

| OLED ID | HIL sublayer 1 | HIL subllayer 2 | Half-life (hr) | AVIR (mV/hr) |
|---|---|---|---|---|
| 2A | 1 nm $CF_x$ | | 91 | 102 |
| 2B | 2 nm $MoO_x$ | | 330 | 4.7 |
| 2C | 2 nm MoOx | 1 nm $CF_x$ | 365 | 4.9 |

The data shown in Table 5 for the OLED 2A show that the $CF_x$ layer in contact with the Ag anode result in OLED with poor stability as evidenced by its short half-life (91 hours) and a large AVIR (102 mV/hr). On the other hand $MoO_x$ in contact with the Ag anode (OLED 2B) yields greatly improved OLED with long half-life and low AVIR. Employing the bilayer HIL configuration—$MoO_x$ adjacent to Ag anode and $CF_x$ adjacent to HTL, as in the OLED 2C, the stability is further improved. The stability of OLED 2C is about 4 times of that of the OLED 2A, which has only one HIL of $CF_x$ and contacts the Ag. The data of Table 2 through Table 5 show that when both $MoO_x$ and $CF_x$ are used in the bilayer HIL structure in the right order, the right order being $MoO_x$ layer is in contact with the Ag anode and $CF_x$ in contact with the $MoO_x$ layer and the NPB HTL the resultant OLED has low drive voltage and long life.

Table 6 show the layer structure and performance data for several OLEDs having the $MoO_x$ and $CF_x$ HILs in the right order. The anode for all these OLEDs were 20 nm thick Ag over which the bilayer HIL structure, 200 nm thick HTL, 60 nm thick Alq EML/ETL and 210 MgAg were sequentially deposited.

TABLE 6

| OLED ID | HIL sublayer 1 | HIL sublayer 2 | Drive voltage (V) | Efficiency (cd/A) | Half-life (hr) | AVIR (mV/hr) |
|---|---|---|---|---|---|---|
| 2D | 1 nm $MoO_x$ | 1 nm $CF_x$ | 7.5 | 3.9 | 381 | 4.4 |
| 2C | 2 nm $MoO_x$ | 1 nm $CF_x$ | 7.5 | 4.0 | 365 | 4.9 |
| 2E | 3 nm $MoO_x$ | 1 nm $CF_x$ | 7.4 | 4.0 | 377 | 5.2 |

The data of Table 6 show that the performance and stability of OLEDs appear not to be significantly dependent on the $MoO_x$ thickness in the bilayer HIL structure. Increasing the thickness of $MoO_x$ in the bilayer structure ($MoO_x/CF_x$) has not increased driving voltage, and that the driving voltage is same as that of the OLED 2A (Table 4) having a single layer $CF_x$ HIL. Thus, using a bilayer structure significantly enhances the operational life, power efficiency and reduces driving voltage.

The invention has been described in detail with particular reference to certain preferred embodiments thereof, but it will be understood that variations and modifications can be effected within the spirit and scope of the invention.

PARTS LIST

200 Organic light-emitting diode
201 Transparent substrate
202 Transparent conducting anode
203 Hole-injection layer
204 Hole transport layer
205 Emissive layer
206 Electron transport layer
207 Reflective conductive cathode
300 Organic light-emitting diode
302 Semitransparent metallic anode
400 Organic light-emitting diode
403 Hole-injecting bilayer structure
403a Hole injecting sublayer 1
403b Hole injecting sublayer 2
500 Organic light-emitting diode
501 Transmission enhancement layer

The invention claimed is:

1. A bottom-emitting OLED device, comprising:
  a) a transparent substrate;
  b) a reflective, semitransparent, and conductive anode layer including a metal or metal alloy or both formed over the substrate;
  c) a plurality of hole-injecting layers disposed over the reflective, semitransparent and conductive anode layer, including a bilayer structure having a layer including an oxide and a layer including a fluorinated carbon;
  d) a plurality of organic layers formed over the plurality of the hole-injecting layer and including an emissive layer having electroluminescent material;
  e) a reflective, opaque and conductive cathode including a metal or metal alloy or both provided over the plurality of organic layers; and
  f) the plurality of the hole-injecting layers being configured to reduce the drive voltage, and the transparency of the anode and the reflectivity of the cathode, and the thickness of the organic layers between the electrodes being selected to change the internal reflection of light to thereby improve the emission through-substrate.

2. The bottom-emitting OLED device of claim 1 wherein the plurality of the hole-injecting layers includes an oxide and a fluorinated carbon layer.

3. The plurality of the hole-injecting layers of claim 2 wherein the oxide layer is in contact with the anode and the fluorinated carbon layer, and the fluorinated carbon layer is in contact with the oxide and the hole-transport layer.

4. The bottom-emitting OLED device of claim 1 wherein the plurality of organic layers includes a hole-transport layer disposed between the fluorinated carbon layer and the emissive layer.

5. The bottom-emitting OLED device of claim 1 wherein the plurality of organic layers includes an electron-transport layer disposed between the emissive layer and the cathode.

6. The bottom-emitting OLED device of claim 1 which further includes a transmission enhancement layer (TEL) disposed between the transparent substrate and the reflective, semitransparent, and conductive anode layer to further improve the amount of light which passes through the substrate.

7. The bottom-emitting OLED device of claim 1 wherein the reflective, semitransparent, and conductive anode includes Ag, Al, Mg, Zn, Rh, Ru, Ir, Au, Cu, Pd, Ni, Cr, Pt, Co, Te, or Mo or alloys or mixtures thereof.

8. The bottom-emitting OLED device of claim 1 wherein the reflective, semitransparent, and conductive anode layer has an absorbance of 30% or less over visible wavelengths.

9. The bottom-emitting OLED device of claim 1 wherein the reflective and conductive cathode includes metal or metal alloys having a work function selected to be about 4.0 eV or less.

10. The bottom-emitting OLED device of claim 9 wherein the metal or metal alloys include alloys of Ag or Al with Mg, alkali metals, alkali earth metals, or Mn.

11. The bottom-emitting OLED device of claim 1 wherein the oxide layer includes ITO, IZO, $Pr_2O_3$, $TeO_2$, $SiO_2$, $VO_x$, or $MoO_x$, or mixtures thereof wherein x is less than 3.

12. The bottom-emitting OLED device of claim 1 wherein the fluorinated carbon layer includes hole-injecting structures including $CF_x$ wherein x is less than 3 and greater than 0.

13. The bottom-emitting OLED device of claim 6 wherein TEL includes ITO, MgO, $MoO_x$, $SnO_2$, $TiO_2$, $Al_2O_3$, $SiO_2$, ZnO, $ZrO_2$, Alq, NPB, SiN, AlN, TiN, SiC, or $Al_4C_3$, or mixtures thereof.

14. The bottom-emitting OLED device of claim 6 wherein the thickness of the TEL ranges from 20 nm to 150 nm.

15. The bottom-emitting OLED device of claim 1 wherein the combined thickness of all layers between the anode and cathode is in the range of 60 nm to 180 nm or 220 nm to 330 nm.

16. The bottom-emitting OLED device of claim 1 wherein the hole transport layer includes NPB.

17. The bottom-emitting OLED device of claim 1 wherein the emissive layer includes Alq.

18. The bottom-emitting OLED device of claim 1 wherein the electron-transport layer includes Alq.

19. The bottom-emitting OLED device of claim 1 wherein the emissive layer contains fluorescent or phosphorescent dopants.

20. The bottom-emitting OLED device of claim 1 wherein the thickness of the hole-transport layer is in the range of 20 nm to 80 nm or 180 nm to 230 nm.

21. The bottom-emitting OLED device of claim 1 wherein the thickness of the anode layer is in a range of from 4 nm to 50 nm.

22. The bottom-emitting OLED device of claim 1 wherein the thickness of the cathode layer is in a range of from 50 nm to 500 nm.

* * * * *